(12) United States Patent
Verstreken et al.

(10) Patent No.: US 11,728,204 B2
(45) Date of Patent: Aug. 15, 2023

(54) HIGH FLOW VACUUM CHUCK

(71) Applicant: KLA Corporation, Milpitas, CA (US)

(72) Inventors: Paul Verstreken, Boutersem (BE); Lai Sze Leong, Tuen Mun (HK)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/171,457

(22) Filed: Feb. 9, 2021

(65) Prior Publication Data

US 2022/0130708 A1 Apr. 28, 2022

Related U.S. Application Data

(60) Provisional application No. 63/104,527, filed on Oct. 23, 2020.

(51) Int. Cl.
*B25B 11/00* (2006.01)
*H01L 21/683* (2006.01)

(52) U.S. Cl.
CPC ........ H01L 21/6838 (2013.01); B25B 11/005 (2013.01)

(58) Field of Classification Search
CPC ........... H01L 21/6838; H01L 21/68785; H01L 21/31051; B25B 11/005
USPC .................................................... 269/21, 20
See application file for complete search history.

(56) References Cited

U.S. PATENT DOCUMENTS

| 6,203,621 B1* | 3/2001 | Tran ...................... B25B 11/005 |
| | | 118/715 |
| 6,597,432 B2 | 7/2003 | Ida |
| 10,754,262 B2 | 8/2020 | Matsumoto |
| 2006/0157905 A1* | 7/2006 | Lenzini ................. B25B 11/005 |
| | | 269/21 |
| 2007/0177125 A1* | 8/2007 | Shibazaki ........... G03F 7/70866 |
| | | 355/72 |
| 2016/0276197 A1* | 9/2016 | Kim .................... H01L 21/6831 |
| 2017/0011951 A1 | 1/2017 | Rieschl et al. |
| 2018/0218928 A1* | 8/2018 | Peh .................... H01L 21/68742 |
| 2018/0284071 A1* | 10/2018 | Wright ................. G01N 29/223 |
| 2020/0312678 A1* | 10/2020 | Morikawa ......... H01L 21/30604 |
| 2021/0050246 A1* | 2/2021 | Choi ................. H01L 21/68785 |

FOREIGN PATENT DOCUMENTS

KR 100648402 B1 11/2006

OTHER PUBLICATIONS

WIPO, International Search Report for International Application No. PCT/US2021/054332, dated Feb. 3, 2022.

* cited by examiner

*Primary Examiner* — Lee D Wilson
*Assistant Examiner* — Shantese L McDonald
(74) *Attorney, Agent, or Firm* — Hodgson Russ LLP (57) ABSTRACT

A vacuum chuck is provided, comprising: a vacuum buffer in fluid communication with a vacuum source, the vacuum buffer being an enclosed volume in the vacuum chuck; a top plate, defining surface features on a first side, and an internal network of distribution channels open to the first side via through holes; and a flow valve configured to control fluid communication between the network of distribution channels and the vacuum buffer. By opening the flow valve, negative pressure is applied from between a substrate disposed on the first side of the top plate through the through holes into the vacuum buffer, thereby flattening the substrate against at least part of the first side of the top plate.

20 Claims, 8 Drawing Sheets

HIGH FLOW VACUUM CHUCK

CROSS-REFERENCE TO RELATED APPLICATIONS

This application claims priority to the provisional patent application filed Oct. 23, 2020 and assigned U.S. App. No. 63/104,527, the disclosure of which is hereby incorporated by reference.

FIELD OF THE DISCLOSURE

This disclosure relates to methods of flattening a substrate and, more particularly, to using a vacuum chuck to flatten a substrate.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

During the fabrication process, flattening may be required before further processes can be performed on a substrate. It can be challenging, for example, to image a substrate if it is not flat. The focus will need to be constantly adjusted across a wide range of values if the substrate is warped, which can impede or even prevent effective inspection or metrology of the substrate. There are various methods typically used to flatten a substrate held by a chuck. First, a high vacuum flow may be applied to the substrate to flatten it against the chuck. However, this requires large vacuum lines and powerful vacuum pumps, which are difficult to integrate due to space constraints and transmit vibrations which negatively impact the fabrication process. Second, suction cups may be applied to the substrate to adapt the shape of the warped substrate. However, downward force applied by the suction cups is limited to the surface of the suction cups, which may cause uneven weight distribution at the start of the flattening cycle and may not be able to fully flatten heavily warped substrates. Third, a clamping device may push down on the substrate. However, this carries a risk of damaging the active area of the substrate, is not well adapted for varying substrate thicknesses, and may not fully flatten the substrate due to uneven force distribution. Each of these methods increase the complexity of the chuck and the maintenance demand of the fabrication process.

Therefore, what is needed is a chuck that is capable of flattening heavily warped substrates and is simple to manufacture.

BRIEF SUMMARY OF THE DISCLOSURE

An embodiment of the present disclosure may provide a vacuum chuck, comprising: a vacuum buffer in fluid communication with a vacuum source, the vacuum buffer being an enclosed volume in the vacuum chuck; a top plate, defining surface features on a first side, and an internal network of distribution channels open to the first side via through holes; and a flow valve configured to control fluid communication between the network of distribution channels and the vacuum buffer.

The vacuum buffer may be integrated with a second side of the top plate. The vacuum buffer may be integrated with a base member disposed on a second side of the top plate. The base member may be sealed to the second side to the top plate by a radially compressed sealing member.

The vacuum chuck may further comprise a lift pin mounted to the base member, which protrudes through the first side of the top plate.

The vacuum chuck may further comprise a leveling device mounted to the base member disposed against the second side of the top plate.

The vacuum chuck may further comprise a plurality of clamps arranged at the perimeter of the top plate, configured to hold the edges of a substrate disposed on the first side of the top plate.

The vacuum chuck may further comprise a plurality of suction cups arranged in ports on the first side of the top plate, in fluid communication with a secondary vacuum source.

The surface features may have a circular pattern, a rectangular pattern, or a center cross pattern. The surface features may comprise a first zone and a second zone located radially outward from the first zone. The first zone and the second zone may be independent from one another. The internal network of distribution channels may comprise a first distribution channel open to the first side of the top plate via through holes located in the first zone, and a second distribution channel open to the first side of the top plate via through holes located in the second zone. The flow valve may comprise a first valve which controls fluid communication between the first distribution channel and the vacuum buffer; and a second valve which controls fluid communication between the second distribution channel and the vacuum buffer.

The vacuum chuck may further comprise a vacuum regulator located between the vacuum buffer and the vacuum source, which regulates the pressure in the vacuum buffer. The vacuum buffer may be at a pressure from −0.05 bar to −1 bar. The vacuum buffer may have a volume from 1 L to 10 L.

The vacuum chuck may further comprise a vacuum tube connecting the vacuum buffer to the vacuum source.

An embodiment of the present disclosure may provide a method of flattening a substrate, comprising: providing a vacuum chuck, comprising: a vacuum buffer in fluid communication with a vacuum source, the vacuum buffer being an enclosed volume in the vacuum chuck; a top plate, defining surface features on a first side, and an internal network of distribution channels open to the first side via through holes; and a flow valve configured to control fluid communication between the network of distribution channels and the vacuum buffer; disposing the substrate on the first side of the top plate; and opening the flow valve to apply negative pressure from between the substrate and the first side of the top plate through the surface features into the vacuum buffer, thereby flattening the substrate against at least part of the first side of the top plate. The substrate disposed on the first side of the top plate may be warped such that there is a deflection up to 5 mm, and by flattening the substrate against at least part of the first side of the top plate, the deflection may be reduced to substantially 0 mm.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
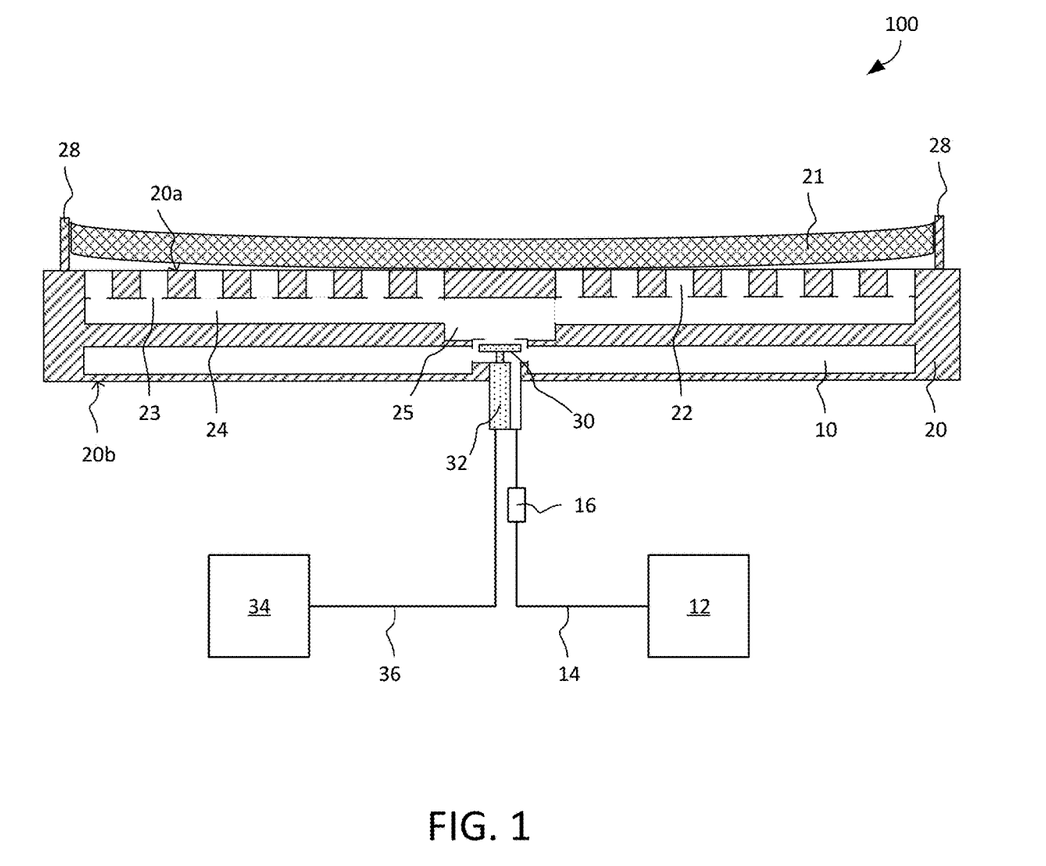
FIG. 1 is a cross-sectional side view of a vacuum chuck according to an embodiment of the present disclosure.
Figure 2A:
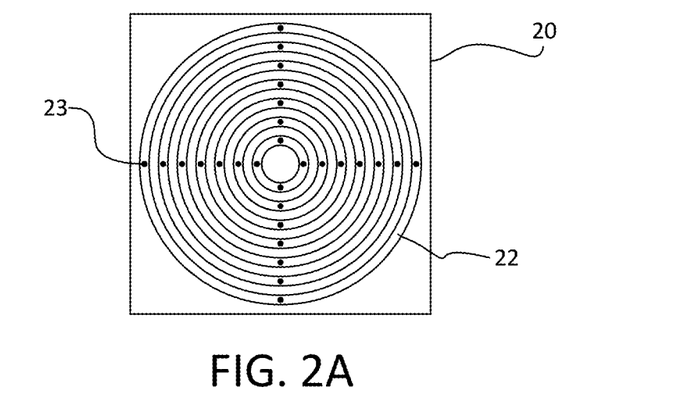
FIG. 2A is a top view of a vacuum chuck according to an embodiment of the present disclosure.
Figure 2B:
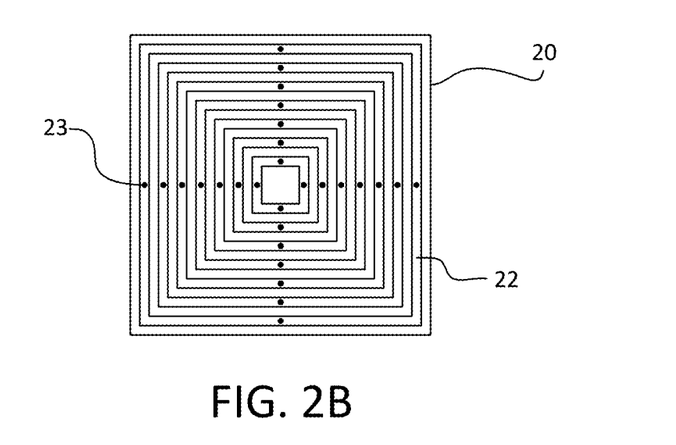
FIG. 2B is a top view of a vacuum chuck according to another embodiment of the present disclosure.
Figure 2C:
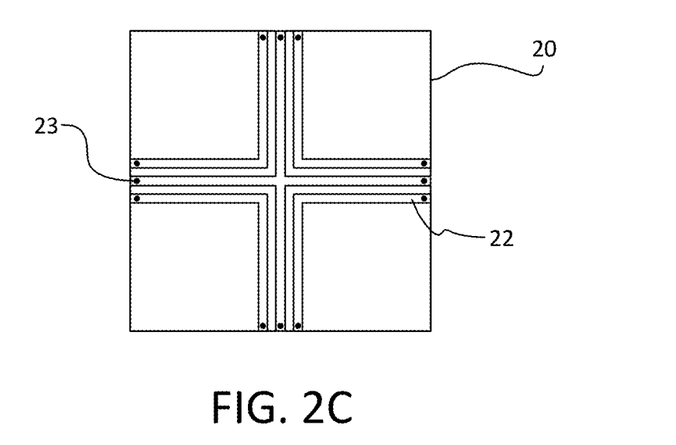
FIG. 2C is a top view of a vacuum chuck according to another embodiment of the present disclosure.

As shown in FIG. 1, an embodiment of the present disclosure may provide a vacuum chuck 100. The vacuum chuck may comprise a vacuum buffer 10. The vacuum buffer 10 may be in fluid communication with a vacuum source 12. The vacuum source 12 may be a vacuum pump with a power from 60 L/min to 120 L/min. For example, to flatten a thin wafer, the vacuum pump power may be from 60 L/min to 90 L/min, and to flatten a thicker panel, the vacuum pump power may be from 90 L/min to 120 L/min. It can be appreciated that previous vacuum chucks may require a much greater vacuum pump power, for example, between 1500 L/min and 3000 L/min.

The vacuum buffer 10 may be connected to the vacuum source 12 via a vacuum tube 14. The vacuum tube 14 may have an internal diameter from 4 mm to 8 mm. For example, a vacuum tube 14 having an internal diameter of 5 mm may be used to flatten a 510 mm by 515 mm double glass panel having a thickness of 3.1 mm and 4 to 5 mm of warpage. It can be appreciated that previous vacuum chucks may require vacuum tubes having a much larger internal diameter, for example, from 38 mm to 50 mm.

The vacuum buffer 10 may be an enclosed volume in the vacuum chuck 100. For example, the vacuum buffer 10 may be totally enclosed in the vacuum chuck 100 except for the input from the vacuum tube 14 and the output to the distribution points of the vacuum chuck 100. The vacuum buffer 10 may have a volume greater than that of the vacuum tube 14. For example, the vacuum buffer 10 may have a volume from 1 L to 10 L. In an embodiment, the vacuum buffer 10 may have a volume of 9.5 L. The enclosed volume of vacuum buffer 10 may be different shapes. For example, the enclosed volume may be a single substantially rectangular prism. Alternatively, the enclosed volume may be a plurality of interconnected cells that are each substantially rectangular prisms.

The vacuum chuck 100 may further comprise a vacuum regulation valve 16. The vacuum regulation valve 16 may be located between the vacuum buffer 10 and the vacuum source 12. For example, the vacuum regulation valve 16 may be connected in-line with the vacuum tube 14 that connects the vacuum buffer 10 to the vacuum source 12. The vacuum regulation valve 16 may regulate the pressure in the vacuum buffer 10. For example, the pressure in the vacuum buffer 10 may be from −0.05 bar to −1 bar.

The vacuum chuck 100 may further comprise a top plate 20. The top plate 20 may be various shapes. For example, the top plate 20 may be circular, rectangular, or any other polygonal shape. In general, the stiffness of the vacuum chuck 100 depends on the thickness of the top plate 20. For example, the top plate 20 may have a suitable stiffness for most semiconductor applications with a thickness from 15 mm to 35 mm. The length and width of the top plate 20 may vary depending on the size of the substrate to be flattened. For example, to flatten a 510 mm by 515 mm panel, the length and width of the top plate 20 may also be 510 mm by 515 mm. To flatten smaller wafers, a smaller top plate 20 may be used. For ease of construction, the length and width of the vacuum buffer 10 may be smaller than or equal to the length and width of the top plate 20, and the vacuum buffer 10 may have a thickness that extends in the z direction to create a volume in the vacuum buffer 10. For example, the length and width of the vacuum buffer 10 may be less than or equal to the length and width of the flattened panel or wafer. When space constraints limit the thickness of the vacuum buffer 10, the length and width of the vacuum buffer 10 may be greater than the length and width of the top plate 20 to create a volume in the vacuum buffer 10.

The top plate 20 may have a first side 20a and a second side 20b opposite the first side 20a. A substrate 21 sought to be flattened may be disposed on the first side 20a of the top plate 20. The substrate 21 can be warped in a convex, concave, or other complex shapes like a saddle or potato chip, one example of which is shown in FIG. 1.

Surface features 22 may be defined on the first side 20a of the top plate 20. The surface features 22 may be depressions in the first side 20a of the top plate 20 or projections on the first side 20a of the top plate. For example, the surface features 22 may be a network of grooves defined on the first side 20a of the top plate 20, a porous structure defined on the first side 20a of the top plate 20, or pin structures defined on the first side 20a of the top plate 20.

In the embodiments shown in FIGS. 1-6, the surface features 22 are defined as a network of grooves. The size and shape of the network of grooves 22 may correspond to the size and shape of the substrate disposed on the top plate. For example, each groove 22 may be from 0.5 mm to 5 mm in width and depth. Grooves 22 with a 2 mm width and a 1.5 mm depth may be suitable to flatten small wafers, while grooves 22 with a 4.5 mm width and a 2 mm depth may be suitable to flatten large panels. The pattern of the surface features 22 may correspond to the size of the substrate 21 disposed on the top plate. For example, the surface features 22 may have a circular pattern (shown in FIG. 2A), a rectangular pattern (shown in FIG. 2B), a center cross pattern (shown in FIG. 2C), any combination thereof, or other designs.

The top plate 20 may have an internal network of distribution channels 24. The internal network of distribution channels 24 may be open to the first side 20a of the top plate 20 via through holes 23. For example, where the surface features 22 are a network of grooves, the network of grooves 22 may be connected to the internal network of distribution channels 24 via the through holes 23. The internal network of distribution channels 24 may extend radially outward from a central distribution hub 25. The central distribution hub 25 may be located centrally in the top plate 20. Alternatively, the central distribution hub 25 may be off-center in the top plate 20.

The vacuum chuck 100 may further comprise a plurality of locating pins 28. The plurality of locating pins 28 may be mounted to, and protrude from, the first side 20a of the top plate 20. When manually loading a substrate 21 on the vacuum chuck 100, the plurality of locating pins 28 may abut the edges of the substrate 21 to ensure proper positioning of the substrate 21 on the first side 20a of the top plate 20.

The vacuum chuck 100 may further comprise a flow valve 30. The flow valve 30 may be configured to control fluid communication between the network of distribution channels 24 and the vacuum buffer 10 by a movable plug. For example, the flow valve 30 may be positioned adjacent to the central distribution hub 25, such that the movable plug may selectively press against a seating in the bottom surface of the central distribution hub 25. When the flow valve 30 is in the open position, fluid communication between the network of distribution channels 24 and the vacuum buffer 10 may be established via the central distribution hub 25. When the flow valve 30 is in the closed position, fluid communication between the network of distribution channels 24 and the vacuum buffer 10 may be cut off at the central distribution hub 25. The flow valve 30 may include an o-ring positioned in a dovetail groove on the top of the movable plug. The o-ring may seal the vacuum buffer 10 from the central distribution hub 25 by pressing against the seating of the central distribution hub 25 when the flow valve 30 is in the closed position.

The flow valve 30 may be moved between the open position and the closed position by an actuator 32. The actuator 32 may be a pneumatic cylinder. The actuator 32 may be controlled by a controller 34. The actuator 32 may be connected to the controller 34 by wiring 36. Alternatively, the actuator 32 may be connected to the controller 34 wirelessly via Bluetooth, Wi-Fi, or any other wireless communication protocol. The actuator 32 may located inside or outside of the vacuum buffer 10.

Various parameters may influence the size of the vacuum buffer 10 and the flattening capacity of the vacuum chuck 100. One or more of the following parameters or additional parameters may be used to determine the required volume of the vacuum buffer 10 to flatten a particular substrate 21. First, the air volume underneath the warped substrate 21, defined by the shape and degree of warpage. Second, the air volume between the surface features 22 in the first side 20a of the top plate 20, defined by the depth and width of the surface features 22. Third, the air volume inside the internal network of distribution channels 24 and the central distribution hub 25. Fourth, the amount of air leaked from the sides of the substrate 21 or through holes in the top plate 20 during the flattening process, defined by the warpage, stiffness, and mass of the substrate 21. Fifth, the minimum pressure needed to keep the substrate 21 fixed on the top plate 20 after flattening, defined by the stiffness of the substrate 21 and the area on the bottom of the substrate 21 in exposed to the vacuum by the surface features.

In an example, a prototype of vacuum chuck 100 was tested to flatten a 510 mm by 515 mm double glass panel having a thickness of 3.1 mm and smiley warped up to 4 mm. In the test setup, the volume of the vacuum buffer was 9.5 L, the total air volume evacuated (volume under the substrate+volume between the surface features+volume inside the internal network of distribution channels and central distribution hub) was 1 L, 45% of the substrate area was in contact with the first side of the top plate, and the vacuum source had a capacity of 120 L/min, which was connected to the vacuum chuck by a vacuum tube with an internal diameter of 5 mm. The beginning pressure in the vacuum buffer was −0.7 bar, and the end pressure in the vacuum buffer after flattening was −0.6 bar. The duration of the flattening process was 0.1 sec. By maintaining the vacuum pressure at −0.6 bar, the panel remained flat against the first side of the top plate. Modifying the surface features so that 95% of the area on the bottom of the substrate is exposed to the vacuum, the vacuum pressure used to flatten the substrate may be reduced to −0.24 bar, and the volume of the vacuum buffer may be reduced to 3 L for the tested large panel. For a smaller wafer, the volume of the vacuum buffer could be further reduced to 1.2 L.

Figure 3:
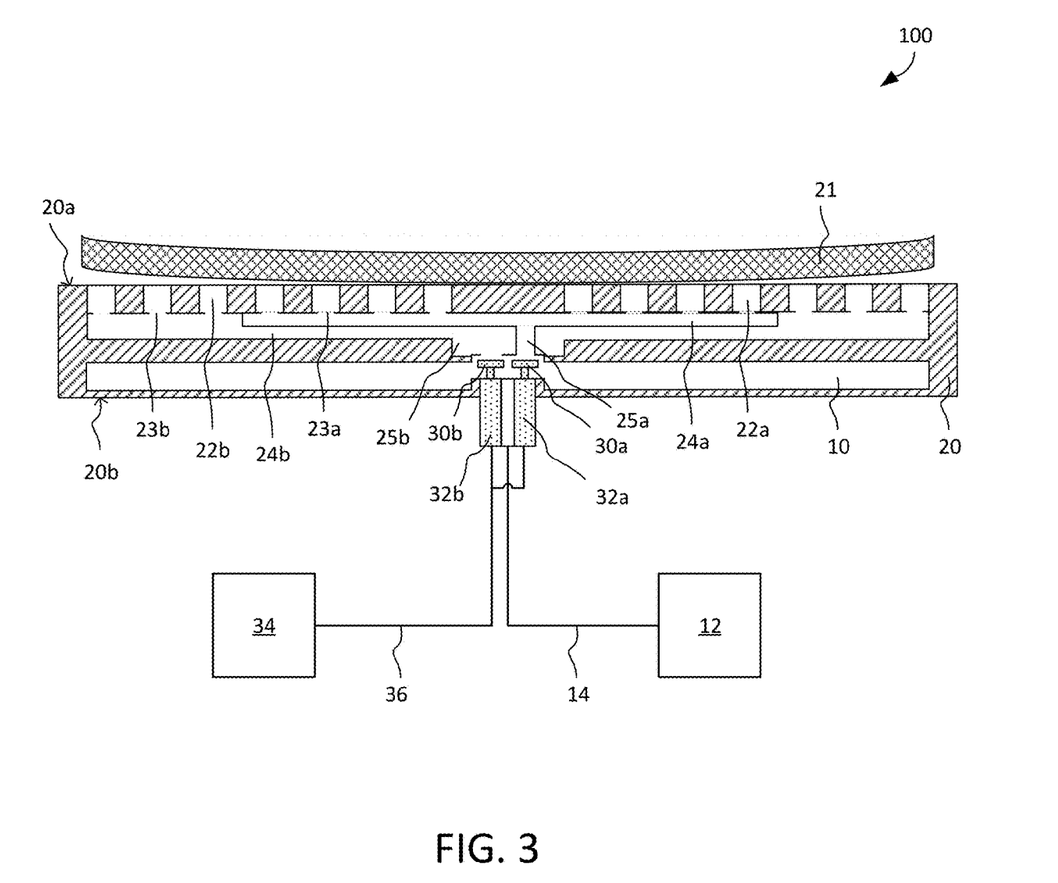
FIG. 3 is a cross-sectional side view of a vacuum chuck according to another embodiment of the present disclosure.

According to an embodiment of the present disclosure, as shown in FIG. 3, the surface features 22 may comprise a first zone 22a and a second zone 22b located radially outward from the first zone 22a. For example, when the surface features 22 have a circular pattern, the first zone 22a may be a circular area, and the second zone 22b may be an annular area that surrounds the first zone 22a. The first zone 22a and the second zone 22b may be independent from one another.

The internal network of distribution channels 24 may comprise a first channel 24a open to the first side 20a via through holes 23a located in the first zone 22a, and a second channel 24b open to the first side 20a via through holes 23b located in the second zone 22b. The central distribution hub 25 may comprise a first hub 25a, from which the first channel 24a extends radially outward, and a second hub 25b, from which the second channel 24b extends radially outward.

The flow valve 30 may comprise a first valve 30a which may control fluid communication between the first channel 24a and the vacuum buffer 10, and a second valve 30b which may control fluid communication between the second channel 24b and the vacuum buffer 10. For example, the first valve 30a may be arranged adjacent to the first hub 25a, and the second valve 30b may be arranged adjacent to the second hub 25b. A pair of actuators 32a-b may be used to control the first and second valves 30a-b, respectively. Alternatively, a single, dual-action actuator may be used to control the first and second valves 30a-b. For example, the first and second valves 30a-b may be concentric, and controlled by a single, concentric actuator. In this way, the vacuum chuck 100 may be operated using the first zone 22a and/or second zone 22b of the surface features 22, to adapt to the size of the substrate 21 to be flattened. For example, the first zone 22a may be suitable for substrates 21 up to 200 mm in diameter, and the second zone 22b may be suitable for substrates 21 up to 300 mm in diameter.

The surface features 22 may comprise additional zones located in different parts of the first side 20a of the top plate 20. For example, the zones may correspond to different, halves, thirds, or quadrants of the top plate 20, and/or the additional zones may each be located radially outward from one another. In each configuration, each zone is independent from one another, with a corresponding distribution channel and valve used to control fluid communication between each zone and the vacuum buffer. The zones may be selectively activated based on the size and shape of the substrate 21 to be flattened.

According to an embodiment of the present disclosure, as shown in FIG. 1, the vacuum buffer 10 may be integrated with a second side 20b of the top plate 20. For example, the vacuum buffer 10 may be an enclosed volume in the top plate 20. In this way, the vacuum chuck 100 may have a compact size to meet size constraints of the fabrication process. In this configuration, the actuator 32 may be located outside of the vacuum buffer 10. For example, the actuator 32 may be disposed on the second side 20b of the top plate 20.

Figure 4:
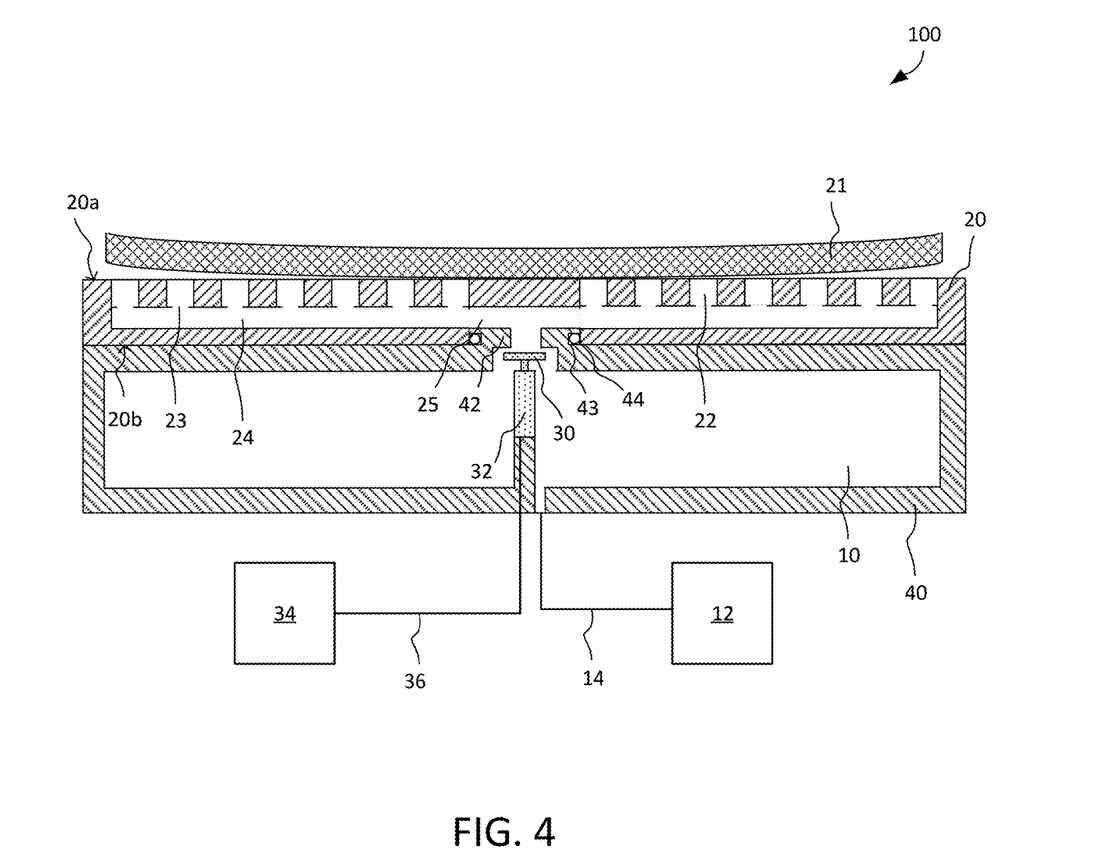
FIG. 4 is a cross-sectional side view of a vacuum chuck according to another embodiment of the present disclosure.
Figure 5:
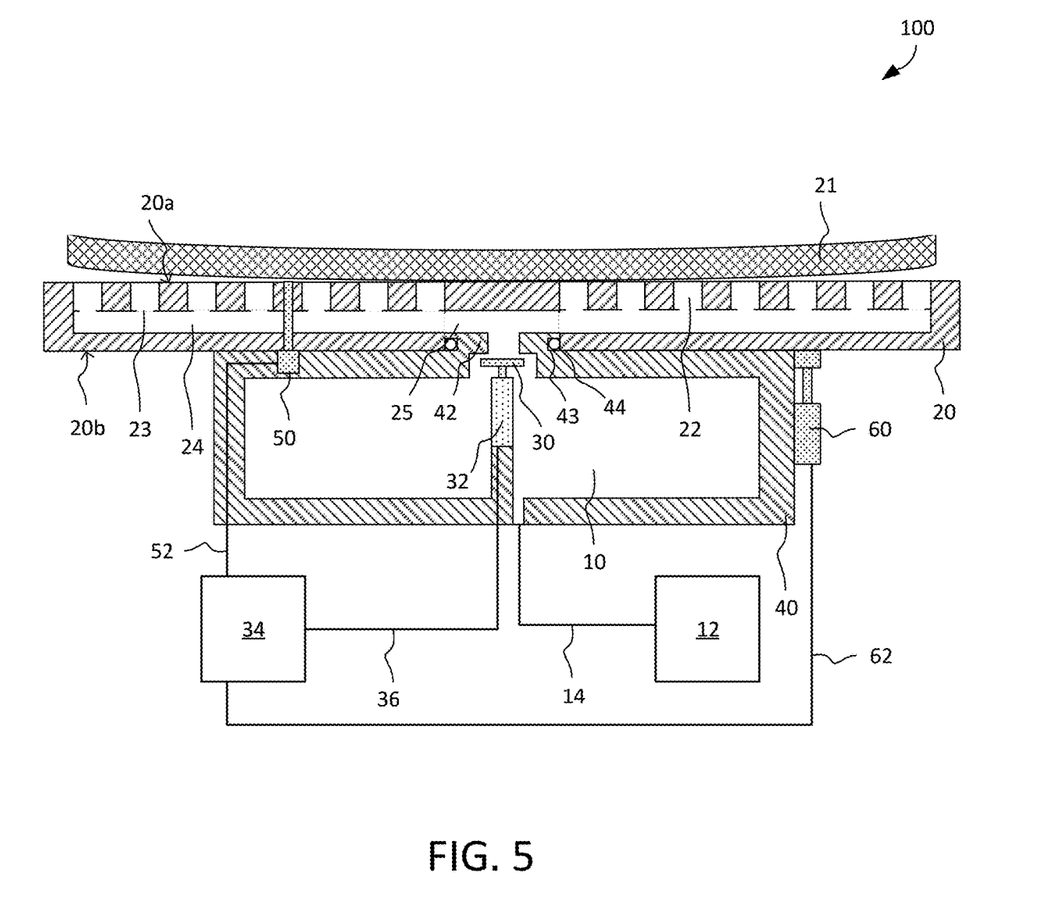
FIG. 5 is a cross-sectional side view of a vacuum chuck according to another embodiment of the present disclosure.

According to an embodiment of the present disclosure, as shown in FIG. 4, the vacuum buffer 10 may be integrated with a base member 40 disposed on the second side 20b of the top plate 20. The base member 40 may be a universal component of the vacuum chuck, compatible with top plates 20 having various sizes and geometries. In this configuration, the actuator 32 may be located inside the vacuum buffer 10. For example, the vacuum buffer 10 may surround the actuator 32 inside the base member 40.

The base member 40 may comprise an annular protrusion 42 adjacent to the flow valve 30. The annular protrusion 42 may be received by a corresponding cavity in the top plate 20. For example, the annular protrusion 42 may be received by the central distribution hub 25 of the top plate 20. In this way, when the base member 40 is disposed on the second side 20b of the top plate 20, fluid communication is established between the vacuum buffer 10 and the central distribution hub 25, controlled by the flow valve 30.

The base member 40 may further comprise a sealing member 44. The sealing member 44 may be an o-ring, quad ring, or any suitable gasket. The sealing member 44 may be positioned in a circumferential seat 43 in the annular protrusion 42. The sealing member 44 may be radially compressed when the annular protrusion 42 is received by the central distribution hub 25. In this way, the base member 40 may be sealed to the second side 20b of the top plate 20 by the sealing member 44.

The vacuum chuck 100 may further comprise a lift pin 50. The lift pin 50 may be mounted to the base member 40. For example, the lift pin can be mounted inside or outside the base member, depending on the size of the substrate. In the embodiment shown in FIG. 5, the lift pin 50 is mounted inside the base member 40. For example, the lift pin 50 may be mounted in a cut out on the top side of the base member 40 and separated from the vacuum buffer 10. In this way, the lift pin 50 may be accessible on the top side of the base member 40 for servicing when the top plate 20 is removed. The lift pin 50 may protrude through the first side 20a of the top plate 20. Accordingly, the lift pin 50 may be configured to lift a substrate 21 off of the first side 20a of the top plate 20. The lift pin 50 may be controlled by the controller 34. The lift pin 50 may be connected to the controller 34 by wiring 52. Alternatively, the lift pin 50 may be connected to the controller 34 wirelessly via Bluetooth, Wi-Fi, or any other wireless communication protocol. An actuator (not shown) can be used to move the lift pin 50 into and out of the top plate 20. For example, the actuator can use a combination of springs and suction or can use other techniques to move the lift pin 50.

The vacuum chuck 100 may further comprise a leveling device 60. The leveling device 60 may be mounted to the base member 40. In the embodiment shown in FIG. 5, the leveling device 60 is mounted outside the base member 40. The leveling device 60 may be disposed against the second side 20b of the top plate 20. Accordingly, the leveling device 60 may be configured to adjust the level of the top plate 20 relative to the base member 40. The leveling device 60 may be a passive mechanical device or an actively controlled device. For example, the leveling device 60 may be controlled by the controller 34 to keep the top plate 20 level or to add a tilt to the top plate 20. It can be appreciated that it may be desirable for some optical inspection processes for the top plate 20 to be level or have a small tilt to enhance some inspection features. The leveling device 60 may be connected to the controller 34 by wiring 62. Alternatively, the leveling device 60 may be connected to the controller 34 wirelessly via Bluetooth, Wi-Fi, or any other wireless communication protocol.

Figure 6:
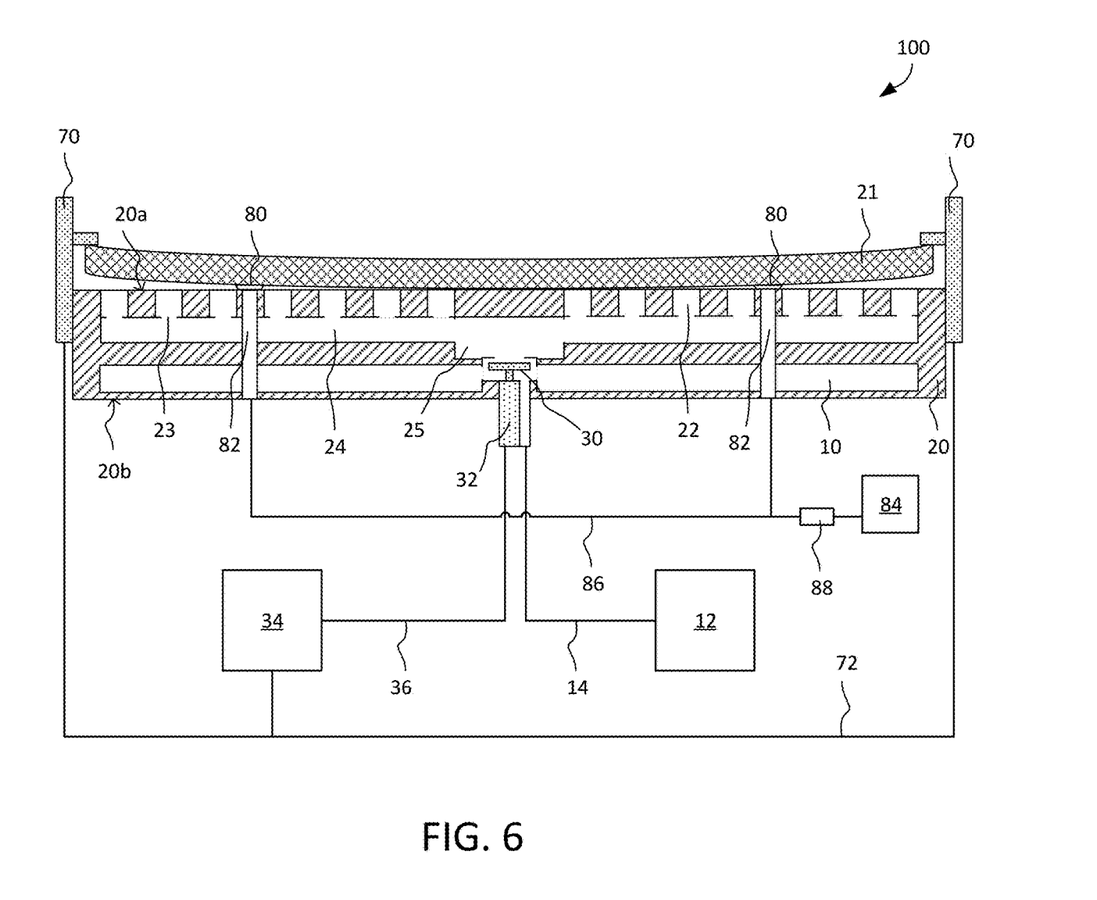
FIG. 6 is a cross-sectional side view of a vacuum chuck according to another embodiment of the present disclosure.

As shown in FIG. 6, the vacuum chuck 100 may further comprise a plurality of clamps 70. The plurality of clamps 70 may be arranged around the perimeter of the top plate 20. The plurality of clamps 70 may be configured to hold the edges of a substrate 21 disposed on the first side 20a of the top plate 20. The plurality of clamps 70 may be mounted to the top plate 20. Alternatively, the plurality of clamps 70 may be mounted to the base member 40. The plurality of clamps 70 may not be used to actively flatten the substrate 21. Instead, the plurality of clamps 70 may be used to hold the substrate 21 to the vacuum chuck 100 prior to and during flattening, the majority of which is performed by suction from the through holes 23 in the first side 20a of the top plate 20. The plurality of clamps 70 may comprise any number of clamps based on the size and geometry of the top plate 20 and the substrate 21. For example, when the top plate 20 is rectangular, there may be four clamps, each arranged at each of the four edges of the top plate 20. The plurality of clamps 70 may be controlled by the controller 34. The plurality of clamps 70 may be connected to the controller 34 by wiring 72. Alternatively, the plurality of clamps 70 may be connected to the controller 34 wirelessly via Bluetooth, Wi-Fi, or any other wireless communication protocol.

The vacuum chuck may further comprise a plurality of suction cups 80. The plurality of suction cups 80 may be arranged in ports 82 on the first side 20a of the top plate 20, which are connected to a separate vacuum circuit. For example, a secondary vacuum source 84 may be provided, which may be connected to the ports 82 by secondary vacuum tubes 86. A secondary vacuum regulation valve 88 may be provided, located between the ports 82 and the secondary vacuum source 84. For example, the secondary vacuum regulation valve 88 may be connected in-line with the secondary vacuum tube 86 that connects the ports 82 to the secondary vacuum source 84. The secondary vacuum regulation valve 88 may regulate the pressure of the plurality of suction cups 80. The plurality of suction cups 80 may not be used to actively flatten the substrate 21. Instead, the plurality of suction cups 80 may be used to hold the substrate 21 to the vacuum chuck 100 prior to and during flattening, the majority of which is performed by suction from the through holes 23 in the first side 20a of the top plate 20. The suction cups 80 may pull the substrate 21 closer to the vacuum chuck 100. This can enable the vacuum chuck 100 to better grip or flatten the substrate 21. For example, the substrate 21 may be highly warped in one location. Due to the warp, the substrate 21 may not be effectively flattened because it is too far from the surface of the vacuum chuck 100. The suction cups 80 may compensate for this distance by pulling the substrate 21 close enough to the vacuum chuck 100 that the vacuum chuck 100 can flatten the substrate 21.

The vacuum chuck 100 of the present application is capable of flattening heavily warped substrates and is simple to manufacture, which provides the following benefits over prior methods. First, the vacuum chuck 100 can use small vacuum lines and a low power vacuum source, which may be easier to integrate in the space constraints of the fabrication process, and transmits limited vibrations. Second, the vacuum chuck 100 may provide even weight distribution for the entire flattening cycle, which allows it to fully flatten heavily warped substrates. Third, there may be less risk of damaging the active area of the substrate because no mechanical clamping is needed to press down on the substrate, so it is well adapted for varying substrate thicknesses. It may be less challenging to perform image processing on a substrate flattened using the vacuum chuck 100 of the present disclosure because, for example, the flattened substrate is easier to focus compared to warped substrates and because the vacuum chuck 100 transmits less vibrations.

Figure 7:
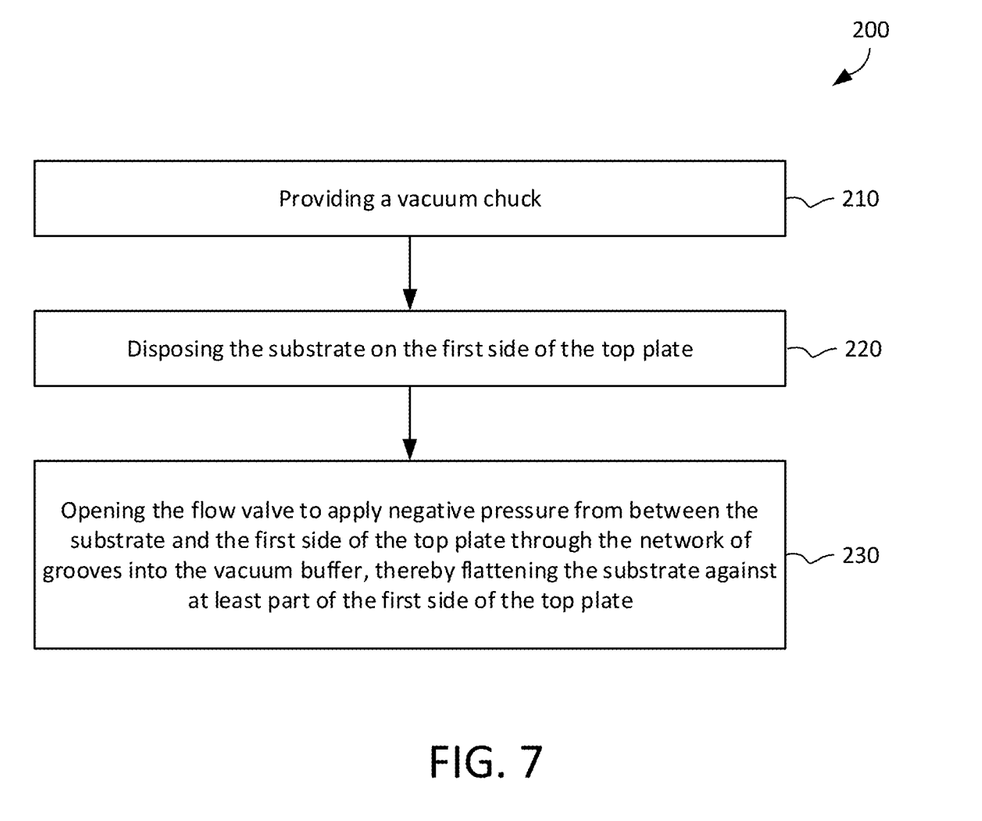
FIG. 7 is a flow chart of a method of flattening a substrate according to an embodiment of the present disclosure.

As shown in FIG. 7, an embodiment of the present disclosure may provide a method 200 of flattening a substrate. The method 200 may comprise the following steps.

At step 210, a vacuum chuck may be provided. The vacuum chuck may comprise a vacuum buffer in fluid communication with a vacuum source. The vacuum buffer may be an enclosed volume in the vacuum chuck. The vacuum chuck may further comprise a top plate, defining surface features on a first side. An internal network of distribution channels may be open to the first side via through holes. The vacuum chuck may further comprise a flow valve configured to control fluid communication between the network of distribution channels and the vacuum buffer.

At step 220, the substrate may be disposed on the first side of the top plate. The substrate may be disposed on the first side of the top plate manually, or it may be disposed using a suitable automatic loading device. The vacuum chuck may comprise a plurality of locating pins which may be mounted to and protrude from the first side of the top plate. The plurality of locating pins may aid disposing the substrate on the first side of the top plate by ensuring the proper position of the substrate.

The vacuum chuck may further comprise a plurality of clamps. The plurality of clamps may be arranged around the perimeter of the top plate. The plurality of clamps may be configured to hold the edges of a substrate disposed on the first side of the top plate. The plurality of clamps may be mounted to the top plate. Alternatively, the plurality of clamps may be mounted to the base member. The plurality of clamps may not be used to actively flatten the substrate. Instead, the plurality of clamps may be used to hold the substrate to the vacuum chuck prior to and during flattening, the majority of which is performed by suction from the through holes in the first side of the top plate. Thus, step 220 may comprise engaging the plurality of clamps to the edges of the substrate after the substrate is disposed on the first side of the top plate.

The vacuum chuck may further comprise a plurality of suction cups. The plurality of suction cups may be arranged in ports on the first side of the top plate, connected to a separate vacuum circuit. The plurality of suction cups may not be used to actively flatten the substrate. Instead, the plurality of suction cups may be used to hold the substrate to the vacuum chuck prior to and during flattening, the majority of which is performed by suction from the through holes in the first side of the top plate. Thus, step 220 may comprise applying the plurality of suction cups to the substrate after the substrate is disposed on the first side of the top plate.

At step 230, the flow valve may be opened to apply negative pressure from between the substrate and the first side of the top plate through the surface features into the vacuum buffer. The flow valve may be opened by an actuator. This may flatten the substrate against at least part of the first side of the top plate.

The surface features may comprise a first zone and a second zone located radially outward from the first zone. For example, when the surface features have a circular pattern, the first zone may be a circular area, and the second zone may be an annular area that surrounds the first zone. The first zone and the second zone may be independent from one another. The internal network of distribution channels may comprise a first channel open to the first side via through holes located in the first zone, and a second channel open to the first side via through holes located in the second zone. The flow valve may comprise a first valve which may control fluid communication between the first distribution channel and the vacuum buffer, and a second valve which may control fluid communication between the second distribution channel and the vacuum buffer. Thus, step 230 may comprise opening the first flow valve and/or second flow valve to apply negative pressure from between the substrate and the first side of the top plate through the first zone and/or second zone into the vacuum buffer.

The substrate disposed on the first side of the top plate may be warped such that there is a deflection up to 5 mm, and by flattening the substrate against at least part of the first side of the top plate, the deflection may be reduced to substantially 0 mm.

Figure 8:
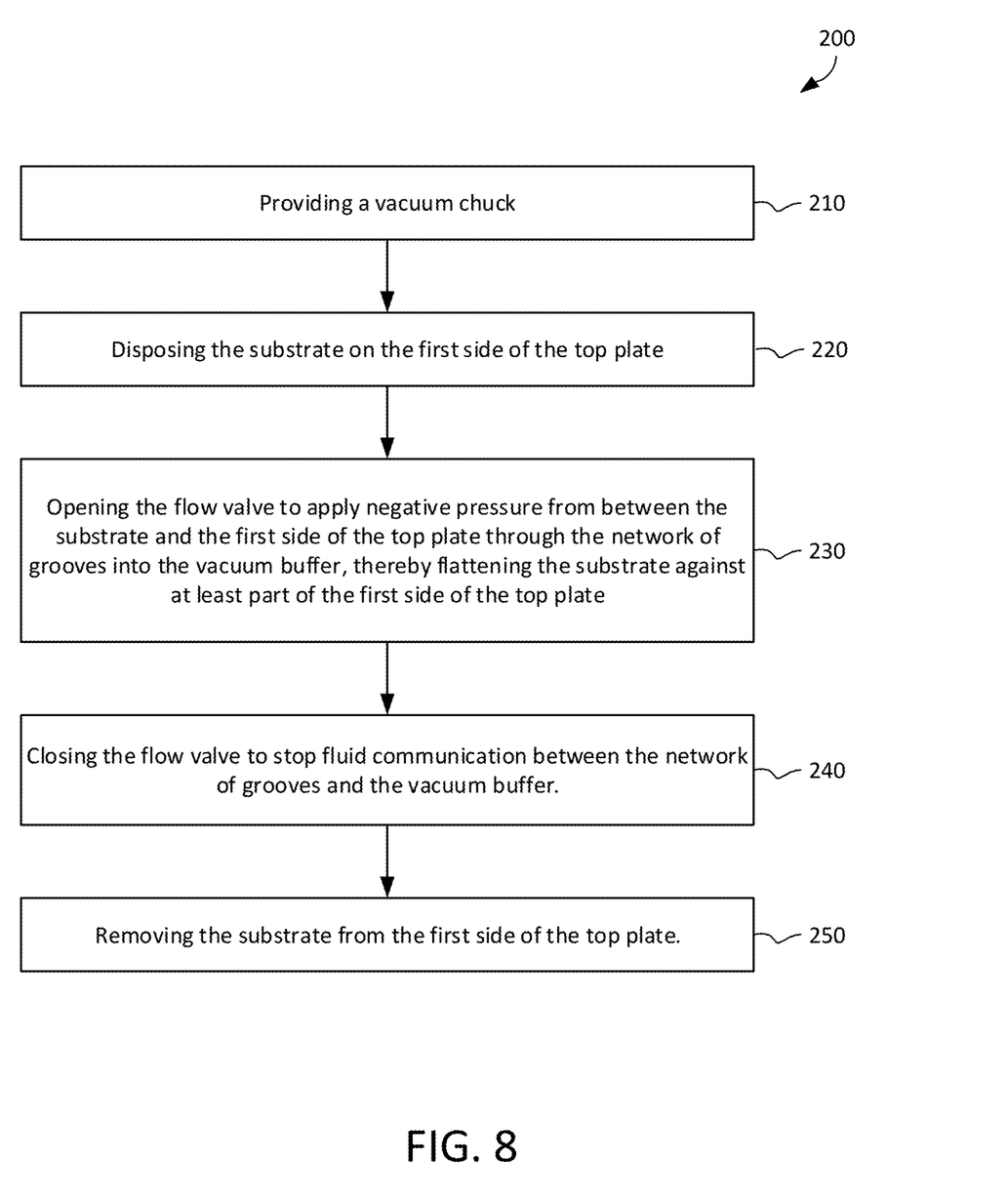
FIG. 8 is a flow chart of a method of flattening a substrate according to another embodiment of the present disclosure.

According to an embodiment of the present disclosure, the method 200 may further comprise the following steps, as shown in FIG. 8.

At step 240, the flow valve may be closed to stop fluid communication between the surface features and the vacuum buffer. The flow valve may be closed by the actuator. The flow valve may be closed after the substrate is sufficiently flattened. For example, the substrate may be sufficiently flattened after 0.1 sec or less, and the flow valve may be closed at a suitable time afterward, before the substrate is removed from the top plate.

At step 250, the substrate may be removed from the first side of the top plate. The substrate may be removed from the first side of the top plate manually, or it may be removed using a suitable automatic removal device, such as a lift pin.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A vacuum chuck, comprising:
 a vacuum buffer in fluid communication with a vacuum source, the vacuum buffer being an enclosed volume in the vacuum chuck;
 a top plate, defining surface features on a first side, and an internal network of distribution channels open to the first side via through holes; and
 a flow valve positioned between the internal network of distribution channels and the vacuum buffer, and configured to control fluid communication between the internal network of distribution channels and the vacuum buffer.

2. The vacuum chuck of claim 1, wherein the vacuum buffer is integrated with a second side of the top plate.

3. The vacuum chuck of claim 1, wherein the surface features have a circular pattern or a rectangular pattern.

4. The vacuum chuck of claim 1, wherein the surface features have a center cross pattern.

5. The vacuum chuck of claim 1, wherein the vacuum buffer is integrated with a base member disposed on a second side of the top plate.

6. The vacuum chuck of claim 5, further comprising:
 a lift pin mounted to the base member, which protrudes through the first side of the top plate.

7. The vacuum chuck of claim 5, further comprising:
 a leveling device mounted to the base member and disposed against the second side of the top plate.

8. The vacuum chuck of claim 5, wherein the base member is sealed to the second side to the top plate by a radially compressed sealing member.

9. The vacuum chuck of claim 1, further comprising:
 a plurality of clamps arranged at the perimeter of the top plate, and configured to hold edges of a substrate disposed on the first side of the top plate.

10. The vacuum chuck of claim 1, further comprising:
 a plurality of suction cups arranged in ports on the first side of the top plate, in fluid communication with a secondary vacuum source.

11. The vacuum chuck of claim 1, wherein the surface features comprise a first zone and a second zone located radially outward from the first zone;
 wherein the first zone and the second zone are independent from one another.

12. The vacuum chuck of claim 11, wherein the internal network of distribution channels comprises a first distribution channel open to the first side of the top plate via through holes located in the first zone, and a second distribution channel open to the first side of the top plate via through holes located in the second zone.

13. The vacuum chuck of claim 12, wherein the flow valve comprises:
 a first valve which controls fluid communication between the first distribution channel and the vacuum buffer; and
 a second valve which controls fluid communication between the second distribution channel and the vacuum buffer.

14. The vacuum chuck of claim 1, further comprising:
 a vacuum regulator located between the vacuum buffer and the vacuum source, which regulates air pressure in the vacuum buffer.

15. The vacuum chuck of claim 1, wherein the vacuum buffer is at a pressure from −0.05 bar to −1 bar.

16. The vacuum chuck of claim 1, wherein the vacuum buffer has a volume from 1 L to 10 L.

17. The vacuum chuck of claim 1, further comprising a vacuum tube connecting the vacuum buffer to the vacuum source.

18. The vacuum chuck of claim 1, wherein the internal network of distribution channels are connected to a central distribution hub, and the flow valve is positioned adjacent to the central distribution hub.

19. A method of flattening a substrate, comprising:
 providing a vacuum chuck, comprising:
  a vacuum buffer in fluid communication with a vacuum source, the vacuum buffer being an enclosed volume in the vacuum chuck;
  a top plate, defining surface features on a first side, and an internal network of distribution channels open to the first side via through holes; and
  a flow valve positioned between the internal network of distribution channels and the vacuum buffer, and configured to control fluid communication between the internal network of distribution channels and the vacuum buffer;
 disposing the substrate on the first side of the top plate; and
 opening the flow valve to apply negative pressure from between the substrate and the first side of the top plate through the through holes into the vacuum buffer, thereby flattening the substrate against at least part of the first side of the top plate.

20. The method of claim 19, wherein the substrate disposed on the first side of the top plate is warped such that there is a deflection up to 5 mm, and by flattening the substrate against at least part of the first side of the top plate, the deflection is reduced to substantially 0 mm.

\* \* \* \* \*